(12) United States Patent
Moriceau et al.

(10) Patent No.: US 10,727,106 B2
(45) Date of Patent: Jul. 28, 2020

(54) METHOD FOR TRANSFER OF A USEFUL LAYER

(71) Applicant: Commissariat a l'energie atomique et aux energies alternatives, Paris (FR)

(72) Inventors: Hubert Moriceau, Saint-Egreve (FR); Christophe Morales, Saint Pierre de Mesage (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 16/225,599

(22) Filed: Dec. 19, 2018

(65) Prior Publication Data
US 2019/0198385 A1 Jun. 27, 2019

(30) Foreign Application Priority Data
Dec. 22, 2017 (FR) ...................................... 17 62975

(51) Int. Cl.
*H01L 21/762* (2006.01)
*H01L 21/268* (2006.01)
*H01L 21/324* (2006.01)

(52) U.S. Cl.
CPC ...... *H01L 21/76254* (2013.01); *H01L 21/268* (2013.01); *H01L 21/3247* (2013.01)

(58) Field of Classification Search
CPC .............................................. H01L 21/76254
USPC ....................................................... 438/458
See application file for complete search history.

(56) References Cited

U.S. PATENT DOCUMENTS

| | | | |
|---|---|---|---|
| 2007/0216042 A1* | 9/2007 | Delprat | H01L 21/02032 438/471 |
| 2008/0064182 A1* | 3/2008 | Hebras | H01L 21/76254 438/455 |
| 2008/0102601 A1* | 5/2008 | Bourdelle | H01L 21/02667 438/458 |
| 2008/0176380 A1* | 7/2008 | Reynaud | H01L 21/02032 438/458 |
| 2010/0096733 A1* | 4/2010 | Guiot | H01L 21/76254 257/632 |
| 2010/0155803 A1* | 6/2010 | Sandhu | H01L 21/84 257/310 |

(Continued)

OTHER PUBLICATIONS

French Preliminary Search Report dated Aug. 31, 2018 in French Application 17 62975, filed on Dec. 22, 2017 (with English Translation of Categories of Cited Documents & Written Opinion).

*Primary Examiner* — Jami Valentine Miller
(74) *Attorney, Agent, or Firm* — Oblon, McClelland, Maier & Neustadt, L.L.P.

(57) ABSTRACT

This method comprises the successive steps of providing a donor substrate comprising a first surface; smoothing the first surface of the donor substrate until a reconstructed surface topology is obtained; forming a first dielectric film on the smoothed first surface of the donor substrate, in such a way that the first dielectric film has a surface that preserves the reconstructed surface topology; implanting gaseous species in the donor substrate, through the first dielectric film, so as to form an embrittlement zone, the useful layer being delimited by the embrittlement zone and by the first surface of the donor substrate; assembling the donor substrate on the supporting substrate by direct adhesion; and splitting the donor substrate along the embrittlement zone so as to expose the useful layer.

18 Claims, 2 Drawing Sheets

(56) References Cited

U.S. PATENT DOCUMENTS

| | | |
|---|---|---|
| 2011/0014775 A1 | 1/2011 | Akiyama et al. |
| 2011/0086492 A1 | 4/2011 | Ohnuma et al. |
| 2013/0302970 A1* | 11/2013 | Daix ................ H01L 21/76254 |
| | | 438/458 |
| 2013/0309843 A1 | 11/2013 | Akiyama et al. |

* cited by examiner

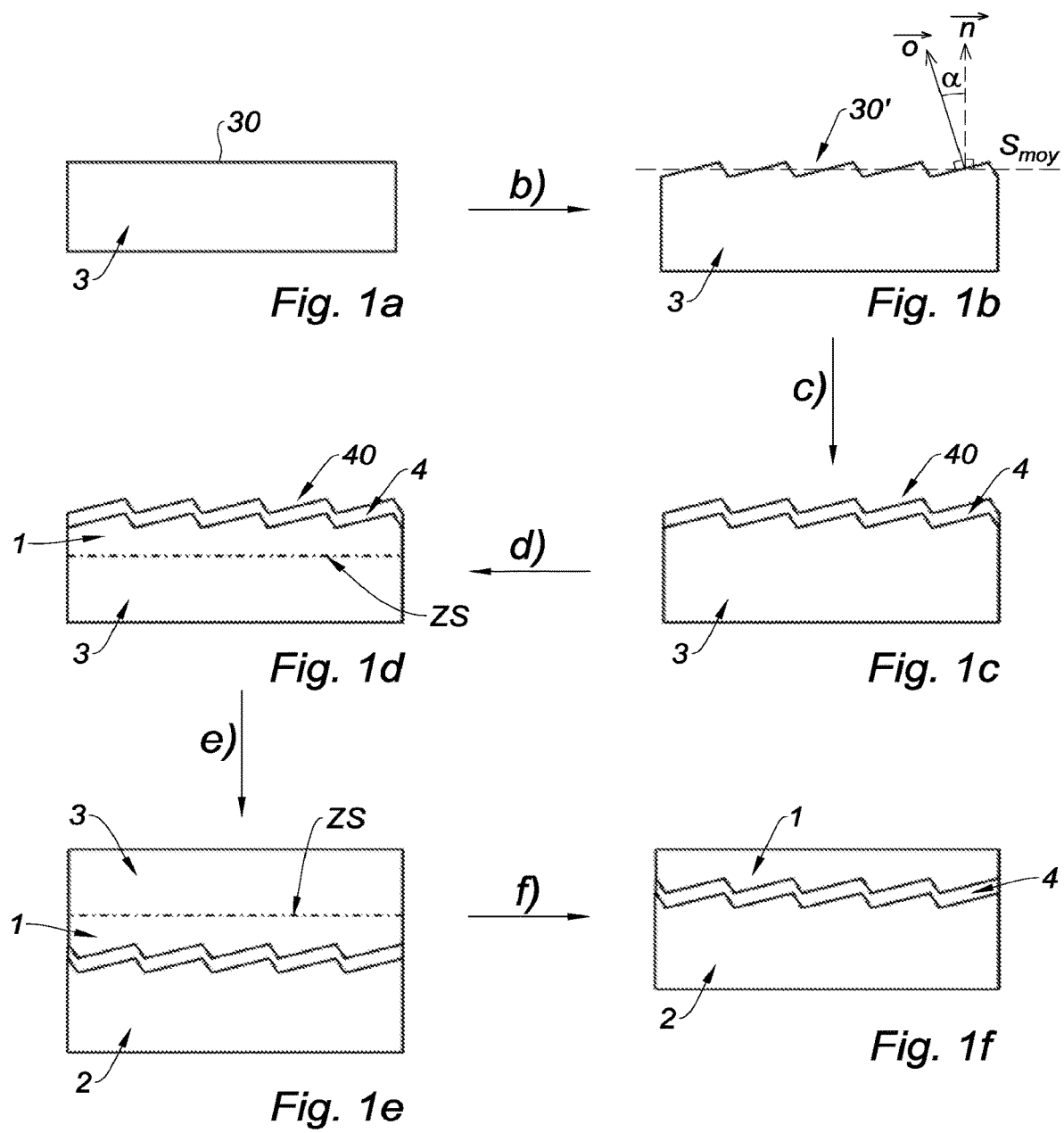

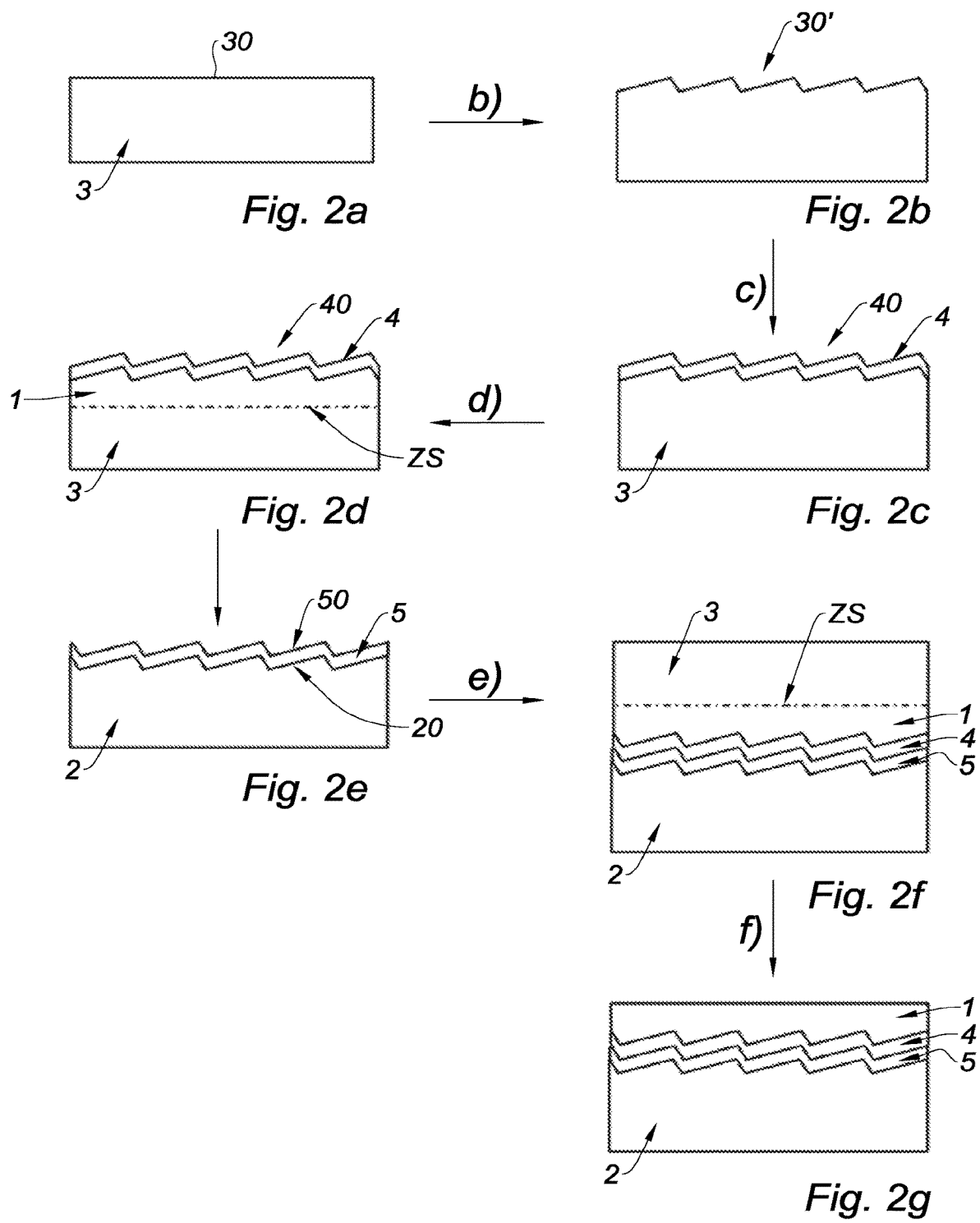

METHOD FOR TRANSFER OF A USEFUL LAYER

TECHNICAL FIELD

The invention relates to the technical field of the transfer of a useful layer onto a supporting substrate by Smart Cut™ technology.

The invention notably finds application in the fabrication of substrates of the SOI (Silicon-on-Insulator) type.

PRIOR ART

A method for transfer of a useful layer onto a supporting substrate, known from the prior art, comprises the successive steps of:
 a') providing a donor substrate comprising a first surface;
 b') forming a first dielectric film on the first surface of the donor substrate;
 c') implanting gaseous species in the donor substrate, through the first dielectric film, so as to form an embrittlement zone, the useful layer being delimited by the embrittlement zone and by the first surface of the donor substrate;
 d') assembling the donor substrate on the supporting substrate by direct adhesion with the first dielectric film;
 e') splitting the donor substrate along the embrittlement zone so as to expose the useful layer.

Conventionally, the donor substrate may be made of silicon and the first dielectric film may be made of $SiO_2$. A method of this kind from the prior art is not entirely satisfactory, insofar as defects are likely to appear after step e') of splitting, in particular starting from the bonding interface between the donor substrate and the supporting substrate. Defects that may be mentioned are zones that have not been transferred, or else zones with bubbles. The number of such defects increases with decreasing thickness of the first dielectric film, i.e. with a thickness between 1 nm and 5 nm.

DISCLOSURE OF THE INVENTION

The invention aims to remedy the aforementioned drawbacks completely or partly. For this purpose, the invention relates to a method for transfer of a useful layer onto a supporting substrate, comprising the successive steps of:
 a) providing a donor substrate comprising a first surface;
 b) smoothing the first surface of the donor substrate until a reconstructed surface topology is obtained;
 c) forming a first dielectric film on the smoothed first surface of the donor substrate, in such a way that the first dielectric film has a surface that preserves the reconstructed surface topology;
 d) implanting gaseous species in the donor substrate, through the first dielectric film, so as to form an embrittlement zone, the useful layer being delimited by the embrittlement zone and by the first surface of the donor substrate;
 e) assembling the donor substrate on the supporting substrate by direct adhesion;
 f) splitting the donor substrate along the embrittlement zone so as to expose the useful layer.

A method of this kind according to the invention makes it possible to reduce significantly the defects that may appear at the bonding interface after step f), owing to steps b) and c). In fact, the smoothing executed in step b) makes it possible to reconstruct the first surface of the donor substrate by reducing its surface roughness to a minimum, namely until there is observable presence of steps at the atomic scale (for example using an atomic force microscope). This surface roughness, reduced to the minimum, is preserved at the surface of the first dielectric film in step c), and if applicable also in the adhesive bonding step e), since the implantation step d) has not modified the nature of the first dielectric film substantially.

The inventors therefore found a link of causality between high surface roughness and a large number of defects at the bonding interface (e.g. zones with pockets of liquid or even of gas), the link of causality being even more marked as the thickness of the first dielectric film decreases (for example having a thickness between 1 nm and 5 nm).

Definitions

"Useful layer" means a layer, starting from which a device may be formed for any type of applications, notably electronic, mechanical, optical etc.

"Reconstructed surface topology" means a lattice of atomic planes (called vicinal planes; in French "terrasses") separated from one another by steps (which may be monatomic or multi-atomic). The reconstructed surface therefore comprises a succession of atomic planes having a principal crystal orientation almost parallel to the normal to the middle surface (or plane nominal surface), i.e. the principal crystal orientation ($\vec{o}$) of the atomic planes and the normal ($\vec{n}$) to the middle surface ($S_{moy}$) form an angle α (called angle of disorientation, cf. FIG. 1b) less than 5°, or even less than 3°.

"Direct adhesion" means spontaneous adhesive bonding resulting from bringing two surfaces into direct contact, i.e. in the absence of an additional element such as glue, wax or solder. Adhesion results mainly from the van der Waals forces due to electronic interaction between the atoms or the molecules of two surfaces, hydrogen bonds due to surface preparations or covalent bonds established between the two surfaces. It is also called bonding by molecular adhesion.

The method according to the invention may comprise one or more of the following characteristic features.

According to one characteristic feature of the invention, step e) is executed in such a way that direct adhesion takes place with the surface of the first dielectric film.

Thus, the first dielectric film provides the buried oxide (BOX) function in the case of fabrication of a substrate of the SOI type. Such a step e) is suitable when the implantation step d) has not modified the nature of the first dielectric film substantially.

According to one characteristic feature of the invention, step d) introduces modifications under the surface of the first dielectric film; the method comprising a step $d_0$) consisting of treating the first dielectric film so as to correct said modifications, step $d_0$) being executed after step d) and before step e).

Thus, one advantage secured is to be able to use the first dielectric film as BOX when the implantation step d) has modified the nature of the first dielectric film substantially.

According to one characteristic feature of the invention, step $d_0$) is executed by applying ultraviolet radiation to the surface of the first dielectric film, under an ozone atmosphere, at a temperature between 20° C. and 500° C., preferably between 20° C. and 400° C., more preferably between 20° C. and 300° C.

Thus, one advantage secured is to be able to ensure the presence of a dielectric film of good quality, compatible with the intended application. The inventors found that temperatures above 500° C. do not allow the surface roughness of the first dielectric film to be reduced. That is why thermal oxidation (for example executed at 900° C. for $SiO_2$) is not suitable for obtaining a reconstructed surface topology. Furthermore, said UV-ozone treatment makes it possible to obtain an oxide allowing adhesive bonding having fewer defects than with thermal oxidation.

According to one characteristic feature of the invention, the method comprises the successive steps of:
  $d_1$) removing the first dielectric film after step d) and before step e);
  $d_2$) forming a second dielectric film on the smoothed first surface of the donor substrate, so that the second dielectric film has a surface that preserves the reconstructed surface topology;
  step e) being executed in such a way that direct adhesion takes place with the surface of the second dielectric film.

Thus, one advantage secured is to dispense with an ad hoc treatment of the first dielectric film when the implantation step d) has modified the nature of the first dielectric film substantially. Here, the second dielectric film provides the BOX function in the case of fabrication of a substrate of the SOI type.

According to one characteristic feature of the invention, step b) is executed by thermal treatment under an atmosphere comprising hydrogenated species, when the donor substrate is made of a material selected from Si, Ge, $Si_xGe_y$.

Thus, one advantage secured is to be able to obtain a reconstructed surface topology easily on the first surface of the donor substrate, quite particularly when the donor substrate is made of silicon, germanium, or an Si—Ge alloy. Such a treatment may also be suitable for certain III-V materials.

According to one characteristic feature of the invention, step c) is executed by oxidation of the first surface of the donor substrate by applying ultraviolet radiation, under an ozone atmosphere, at a temperature between 20° C. and 500° C., preferably between 20° C. and 400° C., more preferably between 20° C. and 300° C.

Thus, one advantage secured by such oxidation is to be able to obtain a reconstructed surface topology easily on the surface of the first dielectric film. The inventors found that temperatures above 500° C. do not allow the surface roughness of the first dielectric film to be reduced. That is why thermal oxidation (for example executed at 900° C. for $SiO_2$) is not suitable for obtaining a reconstructed surface topology.

According to one characteristic feature of the invention, step c) is executed by deposition of the first dielectric film by ALD.

ALD is the acronym for "Atomic Layer Deposition".

Thus, one advantage secured is obtaining a suitable deposit, allowing the reconstructed surface topology of the first surface of the donor substrate to be conserved.

According to one characteristic feature of the invention, the method comprises a step consisting of smoothing a first surface of the supporting substrate until a reconstructed surface topology is obtained; step e) being executed in such a way that direct adhesion takes place with the smoothed first surface of the supporting substrate.

Thus, one advantage secured by smoothing the supporting substrate is that it greatly reduces the number of defects likely to appear at the bonding interface after step f). As mentioned above, said smoothing of the first surface of the supporting substrate makes it possible to reduce its surface roughness to a minimum, namely until there is observable presence of steps at the atomic scale (for example using an atomic force microscope), with a view to step e) of adhesive bonding.

According to one characteristic feature of the invention, the method comprises the steps of:
  smoothing a first surface of the supporting substrate until a reconstructed surface topology is obtained;
  forming an additional dielectric film on the smoothed first surface of the supporting substrate, so that the additional dielectric film has a surface that preserves the reconstructed surface topology;
  step e) being executed in such a way that direct adhesion takes place with the surface of the additional dielectric film.

Thus, the surface roughness of the additional dielectric film is reduced to a minimum, namely until there is observable presence of steps at the atomic scale (for example using an atomic force microscope), with a view to step e) of adhesive bonding. Moreover, the additional dielectric film helps to provide the BOX function in the case of fabrication of a substrate of the SOI type.

According to one characteristic feature of the invention, the first dielectric film and the additional dielectric film have a total thickness less than or equal to 30 nm, preferably less than or equal to 20 nm, more preferably less than or equal to 10 nm.

"Total thickness" means the sum of the thickness of the first dielectric film and of the thickness of the additional dielectric film.

Thus, one advantage secured is obtaining an ultra-thin BOX in the case of fabrication of a substrate of the SOI type.

According to one characteristic feature of the invention, the first dielectric film formed in step c) has a thickness between 0.2 nm and 5 nm or between 0.5 nm and 5 nm.

Thus, one advantage secured is obtaining an ultra-thin BOX in the case of fabrication of a substrate of the SOI type.

According to one characteristic feature of the invention, the donor substrate is made of a semiconductor material, preferably selected from the group comprising Si, Ge, Si—Ge, a III-V material.

"Semiconductor" means that the material has an electrical conductivity at 300 K between $10^{-8}$ S/cm and $10^3$ S/cm.

"III-V material" means a binary alloy between elements located in column III and in column V of the periodic table, respectively.

According to one characteristic feature of the invention, the method comprises a step $e_1$) consisting of applying a thermal treatment to the assembly obtained in step e) according to a thermal budget suitable for reinforcing direct adhesion without initiating splitting of the donor substrate along the embrittlement zone; step $e_1$) being executed before step f).

"Thermal budget" means the choice of a temperature value and a value of the duration of the thermal treatment.

Thus, one advantage secured is reinforcement of the direct adhesion in terms of adherence making it possible to reduce the size of defects likely to appear at the bonding interface.

BRIEF DESCRIPTION OF THE DRAWINGS

Other features and advantages will become clear in the detailed account of various embodiments of the invention, the account being provided with examples and references to the accompanying drawings.

FIGS. 1a to 1f are schematic sectional views illustrating a first embodiment of a method according to the invention.

FIGS. 2a to 2g are schematic sectional views illustrating a second embodiment of a method according to the invention.

The figures are not shown to scale, so as to make them easier to understand.

DETAILED DESCRIPTION OF THE EMBODIMENTS

Elements that are identical or provide the same function will have the same references for the various embodiments, for the sake of simplicity.

In one of its aspects, the invention relates to a method for transfer of a useful layer 1 onto a supporting substrate 2, comprising the successive steps of:

a) providing a donor substrate 3 comprising a first surface 30;

b) smoothing the first surface 30 of the donor substrate 3 until a reconstructed surface topology is obtained;

c) forming a first dielectric film 4 on the smoothed first surface 30' of the donor substrate 3, so that the first dielectric film 4 has a surface 40 that preserves the reconstructed surface topology;

d) implanting gaseous species in the donor substrate 3, through the first dielectric film 4, so as to form an embrittlement zone ZS, the useful layer 1 being delimited by the embrittlement zone ZS and by the first surface 30 of the donor substrate 3;

e) assembling the donor substrate 3 on the supporting substrate 2 by direct adhesion;

f) splitting the donor substrate 3 along the embrittlement zone ZS so as to expose the useful layer 1.

Step a) is illustrated in FIGS. 1a and 2a. Step b) is illustrated in FIGS. 1b and 2b. Step c) is illustrated in FIGS. 1c and 2c. Step d) is illustrated in FIGS. 1d and 2d. Step e) is illustrated in FIGS. 1e and 2f. Finally, step f) is illustrated in FIGS. 1f and 2g.

Donor Substrate

The donor substrate 3 is advantageously made of a semiconductor material, preferably selected from the group comprising Si, Ge, Si—Ge, a III-V material.

Step b) is advantageously executed by thermal treatment under an atmosphere comprising hydrogenated species (for example a hydrogen atmosphere), when the donor substrate 3 is made of a material selected from Si, Ge, $Si_xGe_y$. Generally, step b) is executed by thermal treatment under an atmosphere that is suitable for the material to be reconstructed. As a non-limiting example, when the donor substrate 3 is made of silicon with a first surface 30 of type (1, 0, 0), the thermal treatment may be carried out under hydrogen at 1100° C. for about 1 minute. The reconstructed surface topology obtained at the end of step b) comprises a lattice of vicinal planes at the atomic scale separated by steps that are predominantly monatomic (optionally multiatomic). More precisely, for a first surface 30 of type (1, 0, 0), the reconstructed surface topology comprises an alternation of step edges (of straight shape) and of edges in the form of meanders corresponding to the alternating orientation of the Si—H dimers from one step to the next step. This surface reconstruction is known from the prior art, notably from the documents:

M. Kolmer et al., "*Atomic scale fabrication of dangling bond structures on hydrogen passivated Si (0 0 1) wafers processed and nanopackaged in a clean room environment*", Appl. Surf. Sci., 288, 83-89, 2014;

V. Loup et al., "*Reduced pressure chemical vapour deposition of Si/Si$_{1-x-y}$Ge$_x$C$_y$ heterostructures using a chlorinated chemistry*", Semicond. Sci. Technol., 18, 352-360, 2003.

For other materials such as Ge, Si—Ge, a III-V material, a person skilled in the art will be able to adapt the conditions of partial pressure and/or concentration of hydrogen to allow effective smoothing of the first surface 30 of the donor substrate 3.

First Dielectric Film

Step c) is advantageously executed by oxidation of the first surface 30 of the donor substrate 3 by applying ultraviolet radiation, under an ozone atmosphere, at a temperature between 20° C. and 500° C., preferably between 20° C. and 400° C., more preferably between 20° C. and 300° C. This UV-ozone treatment is preferably applied for a time between 5 minutes and 10 minutes. As a non-limiting example, when the donor substrate 3 is made of silicon, and when the first dielectric film 4 is an $SiO_2$ oxide film, this radical oxidation makes it possible to observe the reconstructed surface topology at the surface of the oxide film, for example by atomic force microscopy.

According to one alternative, step c) is executed by depositing the first dielectric film 4 by ALD. As a non-limiting example, the first dielectric film 4 may be made of $Al_2O_3$.

The first dielectric film 4 formed in step c) advantageously has a thickness between 0.2 nm and 5 nm or between 0.5 nm and 5 nm.

When step d) introduces modifications under the surface 40 of the first dielectric film 4, the method may comprise a step $d_0$) consisting of treating the first dielectric film 4 so as to correct said modifications, step $d_0$) being executed after step d) and before step e). Step $d_0$) is advantageously executed by applying ultraviolet radiation to the surface 40 of the first dielectric film 4, under an ozone atmosphere, at a temperature between 20° C. and 500° C., preferably between 20° C. and 400° C., more preferably between 20° C. and 300° C. The thermal budget of step $d_0$) is selected so as not to weaken the embrittlement zone ZS excessively before step e) of adhesive bonding (e.g. bubbling, exfoliation). Consequently, this UV-ozone treatment is applied for example for a time between 5 minutes and 10 minutes.

According to one alternative, the method may comprise the successive steps of:

$d_1$) removing the first dielectric film 4 after step d) and before step e);

$d_2$) forming a second dielectric film on the smoothed first surface 30' of the donor substrate 3, so that the second dielectric film has a surface that preserves the reconstructed surface topology.

The inventors found that step $d_1$) of removing the first dielectric film 4 had no effect on the reconstructed surface topology on the first surface 30 of the donor substrate 3. When the first dielectric film 4 is made of $SiO_2$, step $d_1$) may be executed using a solution of hydrofluoric acid.

Step $d_2$) is advantageously executed by oxidation of the first surface 30 of the donor substrate 3 by applying ultraviolet radiation, under an ozone atmosphere, at a temperature between 20° C. and 500° C., preferably between 20° C. and 400° C., more preferably between 20° C. and 300° C. This UV-ozone treatment is preferably applied for a time between 5 minutes and 10 minutes. As mentioned above, the thermal budget of the UV-ozone treatment is selected so as not to weaken the embrittlement zone ZS excessively before step e) of adhesive bonding (e.g. bubbling, exfoliation).

According to one alternative, step $d_2$) may be executed by deposition of the second dielectric film by ALD, or by any other technique of deposition at low temperature not affecting the surface topology of the donor substrate 3.

Supporting Substrate

The method advantageously comprises a step consisting of smoothing a first surface 20 of the supporting substrate 2 until a reconstructed surface topology is obtained.

According to one embodiment illustrated in FIG. 2e, the method may comprise the steps of:
  smoothing a first surface 20 of the supporting substrate 2 until a reconstructed surface topology is obtained;
  forming an additional dielectric film 5 on the smoothed first surface 20 of the supporting substrate 2, so that the additional dielectric film 5 has a surface 50 that preserves the reconstructed surface topology.

The smoothing of the first surface 20 of the supporting substrate 2 is advantageously executed by thermal treatment under a hydrogen atmosphere. As a non-limiting example, when the supporting substrate 2 is made of silicon with a first surface 20 of type (1, 0, 0), the thermal treatment may be carried out at 1100° C. for about 1 minute.

Formation of the additional dielectric film 5 is advantageously executed by oxidation of the first surface 20 of the supporting substrate 2 by applying ultraviolet radiation, under an ozone atmosphere, at a temperature between 20° C. and 500° C., preferably between 20° C. and 400° C., more preferably between 20° C. and 300° C. This UV-ozone treatment is applied for example for a time between 5 minutes and 10 minutes. The additional dielectric film 5 may be formed by other techniques, notably by ALD, which makes it possible to obtain greater thicknesses than with UV-ozone treatment.

The first dielectric film 4 and the additional dielectric film 5 advantageously have a total thickness less than or equal to 30 nm, preferably less than or equal to 20 nm, more preferably less than or equal to 10 nm.

Implantation Step d)

The gaseous species implanted in step d) preferably comprise ionized hydrogen atoms.

It is also possible to perform co-implantation with other gaseous species (e.g. helium), or else perform multi-implantation of the same gaseous species.

As a non-limiting example, when the donor substrate 3 is made of silicon, step d) may be executed with ionized hydrogen atoms according to the following parameters:
  energy of 85 keV,
  a dose of $5 \times 10^{16}$ at·cm$^{-2}$.

Step e) of Adhesive Bonding

When the implantation step d) has not modified the nature of the first dielectric film 4 substantially, step e) may be executed in such a way that direct adhesion takes place with the surface 40 of the first dielectric film 4.

When the method employs steps $d_1$) and $d_2$), step e) is executed in such a way that direct adhesion takes place with the surface of the second dielectric film.

When the first surface 20 of the supporting substrate 2 is smoothed, step e) is executed in such a way that direct adhesion takes place with the smoothed first surface 20 of the supporting substrate 2.

In the presence of an additional dielectric film 5, step e) is executed in such a way that direct adhesion takes place with the surface 50 of the additional dielectric film 5.

Step e) of adhesive bonding may be preceded by steps consisting of cleaning or preparing the surfaces to be bonded, for example to prevent contamination of the surfaces with hydrocarbons, particles, or metallic elements. As a non-limiting example, it is possible to treat the surfaces to be bonded using a dilute solution SC1 (mixture of $NH_4OH$ and $H_2O_2$) to generate surface chemical bonds able to produce good adhesion. These steps of cleaning or preparation of the surfaces to be bonded may require the application of a thermal budget that must remain low enough so as not to initiate splitting of the donor substrate 3 along the embrittlement zone ZS, and not to distort the surfaces to be bonded (making them incompatible with subsequent direct adhesive bonding). It will be limited to a thermal budget below 10% of the thermal budget for splitting. "Thermal budget" means the choice of a temperature value and a value of the duration of the thermal treatment. "Thermal budget for splitting" means the total thermal budget to be applied after step d) to obtain splitting at the end of step f). A percentage of the thermal budget for splitting may be defined. The thermal budget for splitting may be described by a law of the Arrhenius type relating the time for splitting (designated t) with a temperature of the thermal treatment (designated T, in K):

$$t = A \exp(-E_a/kT)$$

where:
  A is a constant,
  $E_a$ is a constant corresponding to the activation energy of the mechanism involved in transfer,
  k is the Boltzmann constant.

$E_a$ may be determined experimentally from 2 operating points: it is the slope of the straight line log(t) as a function of $1/kT$.

As $E_a$ is known, for a given temperature $T_1$ it is easy to determine the time $t_1$ necessary for obtaining splitting. By convention, it is said that the percentage of the thermal budget used corresponds to the percentage of the time $t_1$ elapsed at a temperature $T_1$. Thus, for example, to keep to less than 10% of the thermal budget for splitting, a duration t will be selected that is less than $t_1/10$ for thermal treatment at a temperature $T_1$.

As non-limiting examples, these steps of cleaning or preparation of the surfaces to be bonded may be executed by plasma treatment or by ion-beam sputtering (IBS).

Step e) is preferably executed in a medium with a controlled atmosphere. As a non-limiting example, step e) may be executed under high vacuum such as ultrahigh vacuum less than $10^{-2}$ mbar. Step e) may be assisted by ion bombardment or by a plasma.

Step f) of Splitting

Step f) of splitting is advantageously executed by thermal treatment according to a suitable thermal budget.

Reinforcement of the Bonding Interface

The method advantageously comprises a step $e_1$) consisting of applying a thermal treatment to the assembly obtained in step e) according to a suitable thermal budget for reinforcing direct adhesion without initiating splitting of the donor substrate 3 along the embrittlement zone ZS; step $e_1$) being executed before step f).

The thermal budget of step $e_1$) is advantageously selected so as not to exceed 10% of the thermal budget for splitting. As a non-limiting example, the temperature may be of the order of 300° C. for a duration of the order of one hour.

The method advantageously comprises a step g) consisting of applying a thermal treatment to the assembly obtained at the end of step f), according to a suitable thermal budget for reinforcing direct adhesion between the useful layer 1 and the supporting substrate 2.

Embodiment Example No. 1

The donor substrate 3 is a silicon substrate cleaned with solutions of SC1 and SC2, rinsed with deionized water, and then with a solution of HF.

Step b) is executed by thermal treatment of the donor substrate 3, at 1100° C., under a hydrogen atmosphere for 10 minutes, so as to smooth the first surface 30 of the donor substrate 3 until a reconstructed surface topology is obtained.

Step c) is executed by UV-ozone treatment, for one hour, at room temperature, for example in a set-up of the "UV Ozone Cleaner" type from the company SAMCO. Step c) is executed by injecting an ozone stream to form the first dielectric film 4 of $SiO_2$, with a thickness of 1.5 nm.

Step d) is executed with ionized hydrogen atoms according to the following parameters:
energy of 85 keV,
a dose of $5 \times 10^{16}$ at·cm$^{-2}$.

Step $d_1$) is executed by removing the first dielectric film 4 using a solution of HF.

Step $d_2$) is executed by forming the second dielectric film, with a thickness of 1.6 nm, by UV-ozone treatment at 300° C. for 8 minutes.

The first surface 20 of the supporting substrate 2 (made of silicon) is smoothed until a reconstructed surface topology is obtained, by thermal treatment of the supporting substrate 2 at 1100° C. under a hydrogen atmosphere for 3 minutes.

The additional dielectric film 5 is formed on the smoothed first surface 20 of the supporting substrate 2 by UV-ozone treatment at 300° C. for 1 hour.

After step e) of adhesive bonding, step $e_1$) is executed by thermal treatment at 300° C. for 1 hour.

Step f) is executed by thermal treatment at 400° C. for 5 hours.

Embodiment Example No. 2

The donor substrate 3 is a silicon substrate cleaned with solutions of SC1 and SC2, rinsed with deionized water, and then with a solution of HF.

Step b) is executed by thermal treatment of the donor substrate 3 at 1100° C. under a hydrogen atmosphere for 10 minutes, so as to smooth the first surface 30 of the donor substrate 3 until a reconstructed surface topology is obtained.

Step c) is executed by UV-ozone treatment, at 300° C. for 1 hour, for example in a set-up of the "UV Ozone Cleaner" type from the company SAMCO. Step c) is executed by injecting an ozone stream to form the first dielectric film 4 of $SiO_2$, with a thickness of 2 nm.

Step d) is executed with ionized hydrogen atoms according to the following parameters:
energy of 85 keV,
a dose of $6 \times 10^{16}$ at·cm$^{-2}$.

The first dielectric film 4 is cleaned with solutions of SC1 and SC2 in order to ensure good surface hydrophilicity and remove the contaminants left in step d). Step $d_0$) is executed by UV-ozone treatment at 300° C. for 8 minutes in order to heal the first dielectric film 4, i.e. remove the damage caused in step d).

The first surface 20 of the supporting substrate 2 (made of silicon) is smoothed until a reconstructed surface topology is obtained, by thermal treatment of the supporting substrate 2 at 1100° C. under a hydrogen atmosphere for 3 minutes.

The additional dielectric film 5 is formed on the smoothed first surface 20 of the supporting substrate 2 by UV-ozone treatment at 300° C. for 1 hour.

After step e) of adhesive bonding, step $e_1$) is executed by thermal treatment at 300° C. for 1 hour.

Step f) is executed by thermal treatment at 400° C. for 3 hours.

The invention is not limited to the embodiments described. A person skilled in the art is able to consider their technically operative combinations, and replace them with equivalents.

The invention claimed is:

1. A method for transfer of a useful aye on a supporting substrate, comprising the successive steps of:
   a) providing a donor substrate comprising a first surface;
   b) forming a reconstructed surface topology of the first surface of the donor substrate, the reconstructed surface topology comprising a succession of atomic planes having a principal crystal orientation and a plane nominal surface so that the principal crystal orientation and the normal to the plane nominal surface form an angle less than 5°;
   c) forming a first dielectric film on the first surface of the donor substrate, in such a way that a surface of the first dielectric film preserves the reconstructed surface topology;
   d) implanting gaseous species in the donor substrate, through the first dielectric film, so as to form an embrittlement zone, the useful layer being delimited by the embrittlement zone and by the first surface of the donor substrate;
   e) assembling the donor substrate on the supporting substrate by direct adhesion; and
   f) splitting the donor substrate along the embrittlement zone so as to expose the useful layer.

2. The method according to claim 1, wherein step e) is executed in such a way that the direct adhesion takes place with the surface of the first dielectric film on the first surface of the donor substrate.

3. The method according to claim 1,
   wherein step d) introduces modifications under the surface of the first dielectric film;
   the method further comprising a step d0) consisting of treating the first dielectric film so as to correct said modifications, step d0) being executed after step d) and before step e).

4. The method according to claim 3, wherein step d0) is executed by applying ultraviolet radiation to the surface of the first dielectric film, under an ozone atmosphere, at a temperature between 20° C. and 500° C.

5. The method according to claim 1, further comprising the successive steps of:
   d1) removing the first dielectric film after step d) and before step e);
   d2) forming a second dielectric film on the first surface of the donor substrate, so that a surface of the second dielectric film preserves the reconstructed surface topology; and
   step e) being executed in such a way that the direct adhesion takes place with the surface of the second dielectric film.

6. The method according to claim 1, wherein step b) is executed by thermal treatment under an atmosphere comprising hydrogenated species, when the donor substrate is made of a material selected from Si, Ge, and $Si_xGe_y$.

7. The method according to claim 1, wherein step c) is executed by oxidation of the first surface of the donor substrate by applying ultraviolet radiation, under an ozone atmosphere, at a temperature between 20° C. and 500° C.

8. The method according to claim 1, wherein step c) is executed by depositing the first dielectric film by ALD.

9. The method according to claim 1, further comprising:
a step consisting of forming a reconstructed surface topology of a first surface of the supporting substrate,
step e) being executed in such a way that the direct adhesion takes place with the first surface of the supporting substrate.

10. The method according to claim 1, further comprising the steps of:
forming a reconstructed surface topology of a first surface of the supporting substrate; and
forming an additional dielectric film on the first surface of the supporting substrate, so that a surface of the additional dielectric film preserves the reconstructed surface topology,
step e) being executed in such a way that the direct adhesion takes place with the surface of the additional dielectric film.

11. The method according to claim 10, wherein the first dielectric film and the additional dielectric film have a total thickness less than or equal to 30 nm.

12. The method according to claim 1, wherein the first dielectric film formed in step c) has a thickness between 0.2 nm and 5 nm or between 0.5 nm and 5 nm.

13. The method according to claim 1, wherein the donor substrate is made of a semiconductor material.

14. The method according to claim 1, comprising a step e1) consisting of applying a thermal treatment to the assembly obtained in step e) according to a thermal budget for reinforcing the direct adhesion without initiating splitting of the donor substrate along the embrittlement zone, step e1) being executed before step f).

15. The method according to claim 3, wherein step d0) is executed by applying ultraviolet radiation to the surface of the first dielectric film, under an ozone atmosphere, at a temperature between 20° C. and 300° C.

16. The method according to claim 1, wherein step c) is executed by oxidation of the first surface of the donor substrate by applying ultraviolet radiation, under an ozone atmosphere, at a temperature between 20° C. and 300° C.

17. The method according to claim 10, wherein the first dielectric film and the additional dielectric film have a total thickness less than or equal to 10 nm.

18. The method according to claim 13, wherein the semiconductor material is selected from the group comprising Si, Ge, Si—Ge, and a III-V material.

* * * * *